HIGH GAIN OPERATIONAL AMPLIFIER HAVING CONSTANT FREQUENCY RESPONSE CHARACTERISTICS
Filed Sept. 16, 1964

INVENTOR.
LEONARD KEDSON
BY Allan Ratner
Attorney

United States Patent Office 3,383,610
Patented May 14, 1968

3,383,610

HIGH GAIN OPERATIONAL AMPLIFIER HAVING CONSTANT FREQUENCY RESPONSE CHARACTERISTICS

Leonard Kedson, Elberon, N.J., assignor to Electronic Associates Inc., Long Branch, N.J., a corporation of New Jersey Filed Sept. 16, 1964, Ser. No. 396,956
9 Claims. (Cl. 330—16)

ABSTRACT OF THE DISCLOSURE

A transistor direct coupled operational amplifier having multiple stages is provided with an output stage formed of at least one output transistor. To correct for variable output capacitance and thus variable frequency response due to output voltage variation, a compensating transistor having the same voltage capacitance characteristics as the output transistor is connected in circuit with its input terminal connected to the output terminal of the output transistor with the input terminal of the output transistor connected to the output terminal of the compensating transistor. The compensating transistor is biased such that when the potential between the input and output of the output transistor increases, the potential between the input and output of the compensating transistor decreases and vice versa with resulting changes in the capacitance of one transistor cancelling out capacitance changes in the other transistor, the output capacitance of the last stage being determined by the frequency response shaping element of that stage. In this manner, the total frequency response of the amplifier is determined by the individual frequency response shaping elements of each stage and is not affected by variation of the output voltage.

This invention relates to a compensating system and has for an object maintaining a constant amplifier band width for varying voltage levels.

Direct coupled amplifiers are known to have many uses, such as computing elements in a general purpose analog computer. In such computers, direct coupled amplifiers are utilized to amplify slowly varying direct current voltages which flow through the analog computer.

It has been known to use three or more amplifier stages to make up a direct coupled amplifier with the combination of the stages having a desired frequency-amplification characteristic, as described for example in "Design Fundamentals of Analog Computer Components" by R. M. Howe, D. Van Nostrand Co., Inc., 1961, at p. 97 et seq. Each of the amplifier stages includes a frequency response shaping network connected between its input and output and there is an overall feedback network from the output of the last stage to the input of the first stage. The shaping network for the last or output stage may be only a capacitor connected between its input and output in order to obtain the desired high frequency roll-off. The combination of these three or more amplifier stages may provide a composite 6 db slope, for example, necessary for a "first order system" which will provide high stability.

A problem found primarily in transistor direct coupled amplifiers is that the frequency response varies as transistor output voltage levels vary. This frequency response variation results from the fact that the variable output capacitance of a transistor is effectively in parallel with the frequency response shaping capacitor connected between the input and output thereof. For example, since it is the combination or total of these capacitances which determines the high frequency roll-off, and since the output capacitance of the transistor varies with varying voltage levels, it is this total capacitance variation which brings about changes in the roll-off and frequency response. This variation in frequency response changes the composite slope of the amplifier which adversely affects its stability.

Accordingly, an object of the present invention is an amplifier having means for compensating for variations in transistor output capacitance as voltage levels change thereby to maintain a constant frequency response for the amplifier.

Another object of the present invention is an output stage of a direct coupled amplifier having means for compensating for variations in its output capacitance to achieve a constant amplifier band width and high stability regardless of change in voltage levels.

In carrying out the invention in one form thereof a transistor direct coupled amplifier has an output stage comprising at least one output transistor. A frequency response shaping capacitor is connected between an input and an output terminal of the output transistor. In addition, a compensating transistor having the same voltage capacitance characteristics as the output transistor has an input terminal connected to the output terminal of the output transistor and has an output terminal connected to an input terminal of the output transistor. In this way, the output capacitances of the transistors are effectively connected in parallel. That resultant capacitance is effectively connected in parallel with the frequency response shaping capacitance so that the total combination of capacitance provides the desired frequency response characteristics, viz. roll-off. The compensating transistor is reverse-biased for all operating conditions so that as the potential between input and output of the output transistor increases, the potential between input and output of the compensating transistor decreases. In similar manner when the potential between input and output of the output transistor decreases, the potential between input and output of the compensating transistor increases. As a result of these voltage variations a change in output capacitance of the output transistor is compensated for by a change acting in the opposite direction of the capacitance of the compensating transistor so that the foregoing total combination capacitance is maintained substantially constant. As a result the output stage has a substantially constant total frequency response shaping capacitance thereby to provide the desired substantially constant frequency response. In this way there is achieved a constant amplifier band width with a resultant high stability regardless of change in voltage levels.

For further objects and advantages of the invention and for a description of its operation, reference is to be had to the following detailed description taken in conjunction with the accompanying drawings in which:

FIG. 1 schematically illustrates a direct coupled amplifier system embodying the invention;

Figure 1:
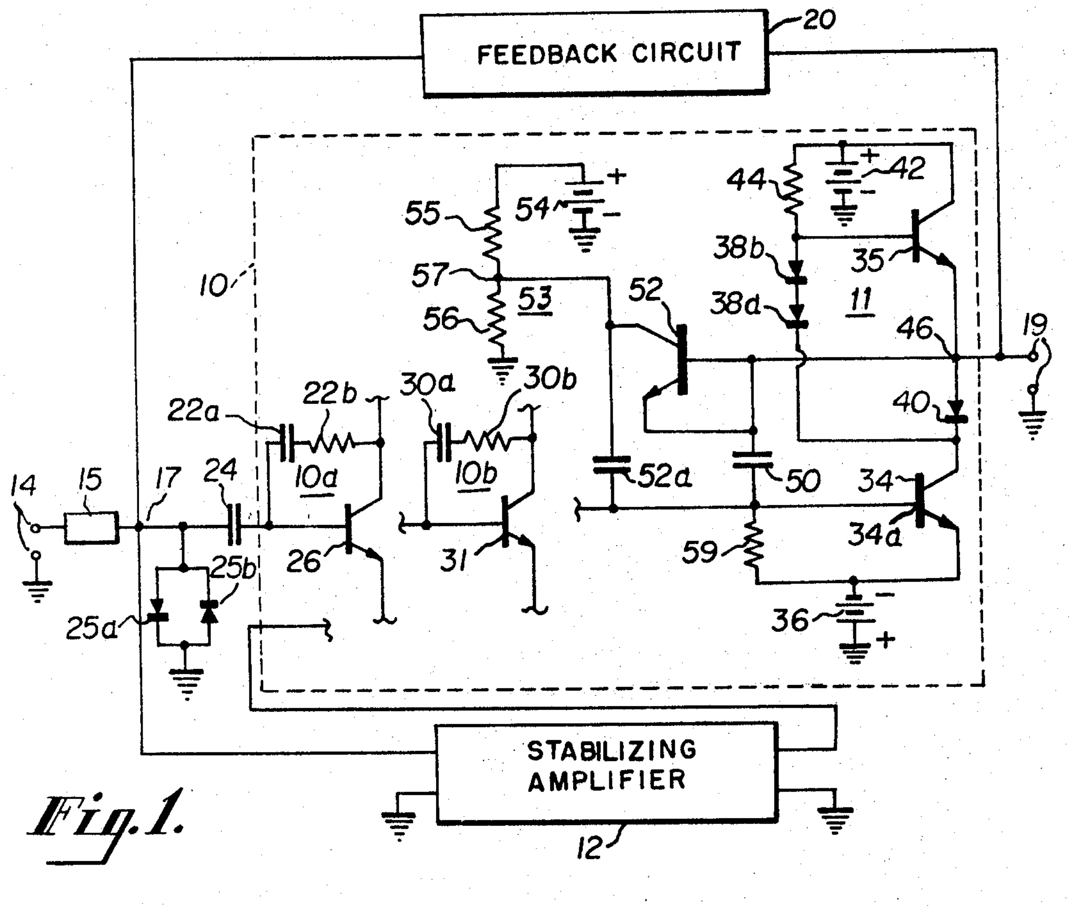

Referring now to the amplifier system illustrated in FIG. 1 there is shown within the rectangle or section 10 a schematic diagram of a multistage direct coupled transistor amplifier including three conventional amplifier stages 10*a* and 10*b* and an output stage 11. The rectangle 12 represents a conventional stabilizing amplifier which may include a resistance-capacitance coupled A.C. amplifier operating in conjunction with a modulator and demodulator. Such stabilizing or balancing amplifiers are well known in the art and are described for example in the above-cited text "Design Fundamentals of Analog Computer Components" at p. 104 et. seq.

A slowly varying direct current input signal is applied to amplifier system input terminals 14. The signal is applied by way of an input circuit 15 to a summing junction 17. There is further applied to the summing junction 17 a feedback signal from an output terminal 19 of the direct coupled amplifier 10 through a feedback circuit 20. As known in the art when the amplifier system is in a condition of balance the feedback signal very nearly cancels out the input signal and the summing junction 17 is maintained at essentially ground potential. The signal that is produced at the summing junction is applied to the base of input transistor 26 of amplifier stage 10*a*.

A pair of diodes 25*a* and 25*b* are parallel connected to each other in opposite polarity sense between the left hand plate of capacitor 24 and ground. These diodes prevent the buildup of excessive direct current voltage on that capacitor. The summing junction 17 is also connected to an input of stabilizing amplifier 12 which modulates, amplifies and demodulates the input signal. The resultant signal provides a balancing or correction voltage for the direct current amplifier 10 and may be introduced to a selected input circuit of that amplifier to compensate for the effects of drift as described, for example, in U.S. Patent No. 3,081,435.

A first frequency response shaping network comprising in series a capacitor 22*a* and a resistor 22*b*, is connected between the collector and base of input transistor 26. The first frequency response shaping network produces for the first stage 10*a* a frequency response shown by the waveform A in FIG. 2. This first stage 10*a* amplifies the input signal and the resultant signal is applied to the base of a second stage transistor 31 having a second frequency response shaping network connected between its collector and its base. That second frequency response shaping network comprises a capacitor 30*a* in series circuit relation with a resistor 30*b*. The second frequency response shaping network provides the second amplifier stage 10*b* with a frequency response shown by the waveform B in FIG. 2. The signal is further amplified in the second stage 10*b* and applied to the input to the base of transistor 34 of a third or output stage 11.

Transistor 34 comprises the lower section of a two transistor output stage 11 with transistor 35 comprising an emitter follower upper section of that output stage. The operation of output stage 11 is described in detail in application Ser. No. 416,822, filed Dec. 8, 1964, entitled Amplifier System by the present applicant and assigned to the same assignee as the present invention.

Specifically, the emitter of transistor 34 is connected to the negative side of a battery 36, the positive side of which is connected to ground. In the quiescent condition, transistor 34 will be almost cut off and its collector will be at approximately zero potential. Series connected diodes 38*a* and 38*b* are connected between the collector of transistor 34 and the base of transistor 35 and the emitter of transistor 35 is connected by way of junction 46 and diode 40 to the collector of transistor 34. With its base and emitter at approximately zero potential transistor 35 is almost cut off since its collector is connected to the positive side of a supply battery 42, the negative side of which is connected to ground. Junction 46 is also at approximately zero potential which is applied to output terminal 19.

In this quiescent condition diodes 38*a*, 38*b* and 40 are maintained conductive as a result of the biasing conditions applied to transistors 34 and 35 causing small currents to flow through these transistors. More particularly, current flow may be traced by way of the positive side of battery 42, a resistor 44, diodes 38*b* and 38*a*, transistor 34 and to the negative side of battery 36. In addition, a small current flow may also be traced from the positive side of battery 42, transistor 35, junction 46, diode 40, transistor 34 to the negative side of battery 36.

When the input signal applied to transistor 34 is positive-going that transistor is biased to conduct more heavily than in its quiescent condition. Thus a negative-going signal is produced at its collector which is applied by way of diode 40 and diodes 38*a* and 38*b* to the emitter and base respectively of transistor 35. As a result the conductivity of transistor 35 is decreased from its quiescent condition. In addition that negative-going signal also appears at the output terminal 19. The input positive-going signal to transistor 34 may be increased until that transistor is fully conductive and thus substantially all of the negative potential of battery 36 may appear at output terminal 19. In this manner a positive-going input signal produces a corresponding negative-going amplified output signal at terminal 19.

When the input signal to transistor 34 is negative-going that transistor is biased to become less conductive than in its quiescent condition and approaches its fully cut-off state. Thus, a positive-going signal appears at its collector which is applied both to the base and emitter of transistor 35 and also appears at output terminal 19. As a result the conductivity of transistor 35 is increased from its quiescent condition until at its fully conductive state substantially all of the positive potential of battery 42 may appear at output terminal 19. In this manner a negative-going input signal produces a corresponding amplified positive-going output signal at terminal 19.

As previously described, the direct coupled amplifier section 10 may be comprised of three amplifier stages 10*a*, 10*b*, and 11 having an overall feedback network 20. The first amplifier stage 10*a* has a first frequency response shaping network and produces a frequency response shown by the waveform A in FIG. 2. The second amplifier stage 10*b* has a second frequency response shaping network and produces a frequency response shown by the waveform B in FIG. 2. The third or output stage 11 includes only a frequency response shaping capacitor 50 connected between the collector and base of output transistor 34. The output capacitance *Cob* of transistor 34 is effectively in parallel with the frequency response shaping capacitor 50 and therefore it is the combination of these capacitances which determines the high frequency roll-off of the third stage 11 as shown by the waveform C in FIG. 2. The combination of waveforms A, B and C is shown by the dotted line D in FIG. 2 and provides a desired composite 6 db slope which is necessary for a first order system which provides the desired high stability.

Figure 2:
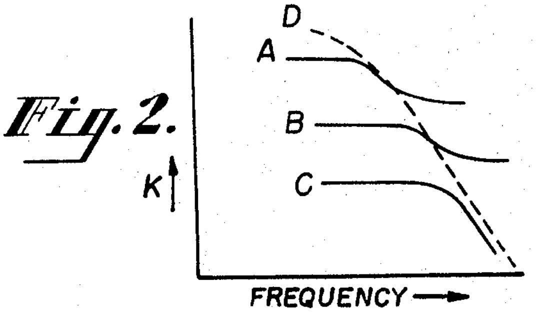
FIG. 2 illustrates the frequency response characteristics of each of the three stages of the direct coupled amplifier of the amplifier system of FIG. 1.
Figure 3:
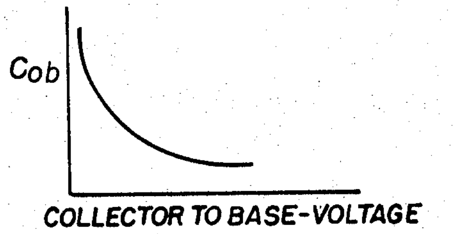
FIG. 3 illustrates the capacitance-voltage characteristics for a transistor.

However, the output capacitance *Cob* of transistor 34 is a function of the voltage impressed across its collector to base junction, as shown in FIG. 3. Thus as the output voltage changes, the output capacitance *Cob* varies and in this way the total capacitance (*Cob* and capacitor 50 in parallel) varies. As a result the high frequency roll-off and the frequency response as shown in FIG. 2 change as the voltage changes which adversely affects the stability and the band width of the amplifier.

In order to compensate for variations in the output capacitance *Cob* there is provided according to the invention, a reverse biased compensating transistor 52 having the same voltage-capacitance characteristics as the transistor 34 as shown in FIG. 3. The base and emitter of transistor 52 are connected to the junction 46 and the collector of that transistor is connected by way of a capacitor 52*a* to the base of transistor 34. In this way, the voltage-capacitance changes of transistor 52 will act in an opposite direction to that of transistor 34 as will later be described in detail. A suitable biasing potential is applied to the collector of transistor 52 by means of a voltage divider 54 comprising battery 53 having its positive side connected by way of voltage divider resistors 55 and 56 to ground. The common junction 57 of the voltage divider 54 resistors is connected to the collector.

As previously described the potential at junction 46 may vary from approximately the positive potential of battery 42 to approximately the negative potential of battery 36. The voltage divider 54 components are selected so that the positive potential at junction 57 is of sufficient amplitude so that for all variations of potential at junction 46, transistor 52 is always reverse biased. In operation, with (1) the junction 46 at substantially the positive potential of battery 42 and (2) the base of transistor 34 at a relatively fixed high negative potential as a result of its connection by way of resistor 59 to the negative side of a battery 36, there is a substantially high potential difference from collector to base of transistor 34. As shown in FIG. 3, the output capacitance *Cob* will be at a substantially small value as a result of that high voltage impressed across the collector to base junction of transistor 34. On the other hand, the high positive potential of junction 46 is applied to the base and emitter of compensating transistor 52 and its collector is maintained at a somewhat higher positive potential by voltage divider 54 to maintain that transistor reverse biased. In this way the potential from base to collector of transistor 52 is substantially small and as shown in FIG. 3 the output capacitance of that transistor will be on the high side of the curve. The total output capacitance *Cob* is shown by the solid line in FIG. 4 while output capacitance of each transistors 52 and 34 are shown by the indicated dashed lines. In the example assumed above, the output voltage (the voltage at junction 46) is indicated by the reference character 61. Since the output capacitance of transistor 52 is high and the output capacitance of transistor 34 is low the resultant output capacitance is indicated by point *61a* on solid line 62.

Figure 4:
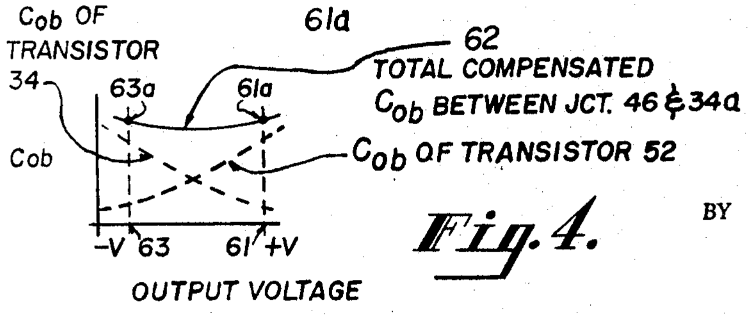
FIG. 4 illustrates the capacitance-voltage characteristics for an output transistor shown in FIG. 1 with compensation.

In manner similar to that described above when junction 46 is at approximately the negative potential of battery 36 (indicated by reference character 63, FIG. 4) the potential across the collector-base junction of output transistor 34 will be relatively small. On the other hand with a relatively high negative potential at junction 46 and a relatively high positive potential at junction 57 there will be produced a relatively high potential across the collector-base junction of compensating transistor 52. Thus the output capacitance of compensating transistor 52 will be substantially small and the output capacitance of output transistor 34 will be substantially high as shown in FIG. 4. The resultant output capacitance is indicated by point *63a* on the solid line 62. The above analysis can be applied at differing points between the two extremes 61 and 63 of potential at junction 46. It will be understood that the total output capacitance of transistors 34 and 52 is shown by the solid line 62 which indicates a substantially constant output capacitance *Cob* for all possible output voltage levels.

The total or resultant output capacitance of transistors 34 and 52 are effectively in parallel with the frequency response shaping capacitor 50 so that this combination determines the desired roll-off of the amplifier as shown in FIG. 2. Since the change in capacitance of compensating transistor 52 cancels out the change in capacitance of transistor 34 the combined capacitance is maintained substantially constant. Thus, in accordance with the invention the frequency response of the amplifier illustrated in FIG. 2 remains substantially constant for varying voltage levels. Thus with such constant frequency response there is provided the desired high stability and constant band width.

The principles of the invention having now been explained, it is to be understood that many modifications may be made all within the scope of the following claims. For example, a compensating transistor may be utilized in stages other than the output stage of an amplifier in which it is required that the output capacitance be maintained constant for varying voltage levels. While transistors 26, 31, 34 and 35 have been shown as NPN transistors it will be understood that these transistors may be of the PNP type or any combination of NPN and PNP transistors may be utilized with the corresponding changes in the polarity of the batteries. In addition, it will be understood that the compensating transistor may be replaced by other semiconductor devices which exhibit the same voltage-capacitance characteristics as the transistor being compensated. However, in accordance with the invention such semi-conductor device is biased in a reverse direction.

What is claimed is:

1. In a stabilized direct coupled amplifier system having a substantially constant band width the combination which comprises,
- a summing junction and an output terminal,
- a multistage direct coupled amplifier having an input stage and an output stage connected to said output terminal,
- a feedback circuit connected between said output terminal and said summing junction,
- means including a stabilizing amplifier coupled between said summing junction and said multistage amplifier,
- means connecting said summing junction to an input of said input stage,
- said output stage including at least one semiconductor output device having at least an input electrode and an output electrode, said device having voltage-capacitance characteristics in which its output capacitance varies in a predetermined relation with changes in the output potential at said output electrode,
- frequency response shaping means connected between said input and output electrodes of said output device,
- a semiconductor compensating device having at least an input electrode and an output electrode and similar voltage capacitance characteristics as said output device,
- means for nonconductively biasing said compensating device, and
- means connecting said input and output electrodes of said compensating device to said output device to provide the voltage-capacitance characteristics of said compensating device acting in an opposite direction to that of said output device to produce a substantially constant total frequency shaping capacitance for all output potential variations thereby to produce said substantially constant band width.

2. The amplifier system of claim 1 in which said output device and said compensating device are transistors each having at least an emitter, base and collector,
- in which said frequency response-shaping means comprises a capacitor connected between said collector and said base of said output transistor, and
- means connecting (1) said collector of said compensating transistor to said base of said output transistor and (2) said base and emitter of said compensating transistor to said collector of said output transistor whereby the total output capacitance of said output transistor is maintained substantially constant for all output potential variations.

3. A direct coupled amplifier system having a predetermined frequency response comprising
- a summing junction and an output terminal,
- a multistage direct coupled amplifier including an input stage and an output stage connected to said output terminal,
- means connecting said summing junction to an input electrode of said input stage,
- at least one of said stages including a first transistor having a collector, a base, and an emitter, said first transistor having voltage capacitance characteristics characterized in that the output capacitance of said transistor is of substantially large value when the collector to base potential is substantially small and said output capacitance decreases as said potential increases, a second transistor having at least a collector, a base, and an emitter and having a voltage-capacitance characteristics similar to that of said first transistor for compensating for changes in capacitance of said first transistor, means for reverse biasing the collector to base junction of said second transistor, said emitter of said second transistor being connected to said collector of said first transistor, means connecting (1) said base of said second transistor to said collector of said first transistor and (2) said collector of said second transistor to said base of said first transistor whereby the voltage-capacitance characteristics act in opposite directions to produce a resultant capacitance which is substantially constant for all voltage variations, and a frequency response shaping circuit connected between said collector and said base of said first transistor.

4. The amplifier system of claim 3 in which there is provided a feedback circuit connected between said output terminal and said summing junction, and means including a stabilizing amplifier coupled between said summing junction and said multistage direct coupled amplifier.

5. The amplifier system of claim 3 in which said first transistor is an output transistor and in which there is further provided a third transistor having at least a collector, a base, and an emitter, and means connecting said base and emitter of said third transistor to said collector of said first transistor.

6. The amplifier system of claim 3 in which there is provided a frequency response shaping network for each of the stages of said direct coupled amplifiers to provide a predetermined frequency response for said amplifier system.

7. A direct coupled transistor amplifier system for compensating for changes in transistor output capacitance with changing transistor output potential comprising a first transistor having at least an emitter, a base and a collector, said first transistor having collector to base voltage-capacitance characteristics characterized in that the output collector to base capacitance of said first transistor is of substantially large value when the collector to base potential is substantially small and said output capacitance decreases as said potential increases, a second transistor having at least a collector, a base and an emitter and having collector to base voltage-capacitance characteristics similar to that of said first transistor, said emitter and base of said second transistor being directly connected together, means connecting (1) said interconnected emitter and base of said second transistor directly to said collector of said first transistor and (2) said collector of said second transistor to said base of said first transistor, supply means connected to said first transistor for reverse biasing the collector to base junction and for forward biasing the base to emitter junction, means connected to said second transistor for reverse biasing the collector to base junction of said second transistor to provide for the base to collector junction of said second transistor to be in parallel relation but not to neutralize the feedback from the collector to base junction of said first transistor whereby the changes in collector to base capacitance in said second transistor act to compensate for changes in collector to base capacitance in said first transistor to produce at said collector of said first transistor a total output capacitance which is substantially constant for variations in output potential.

8. The system of claim 7 in which there is provided a multistage direct coupled amplifier including an input stage and an output stage and said output stage including said first and second transistors.

9. The system of claim 8 in which there is provided a summing junction and an amplifier system output terminal, means connecting said summing junction to an input of said input stage, means connecting said output stage to said output terminal, and means including a stabilizing amplifier coupled between said summing junction and said multistage amplifier.

References Cited

UNITED STATES PATENTS

| | | | |
|---|---|---|---|
| 3,133,278 | 5/1964 | Millis | 330—16 |
| 3,204,192 | 8/1965 | Barditch et al. | 330—27 |

ROY LAKE, *Primary Examiner.*

E. C. FOLSOM, *Assistant Examiner.*